US012568795B2

(12) United States Patent
Abe et al.

(10) Patent No.: US 12,568,795 B2
(45) Date of Patent: Mar. 3, 2026

(54) ASSEMBLED GRID TRAY

(71) Applicant: Applied Materials, Inc., Santa Clara, CA (US)

(72) Inventors: Shinobu Abe, Osaka (JP); Chang Hee Shin, Milpitas, CA (US); Shinichi Kurita, San Jose, CA (US); Masahiko Kowaka, Osaka (JP)

(73) Assignee: Applied Materials, Inc., Santa Clara, CA (US)

( * ) Notice: Subject to any disclaimer, the term of this patent is extended or adjusted under 35 U.S.C. 154(b) by 193 days.

(21) Appl. No.: 18/024,318

(22) PCT Filed: Aug. 18, 2021

(86) PCT No.: PCT/US2021/046482

§ 371 (c)(1),
(2) Date: Mar. 2, 2023

(87) PCT Pub. No.: WO2022/072075

PCT Pub. Date: Apr. 7, 2022

(65) Prior Publication Data

US 2023/0260811 A1 Aug. 17, 2023

Related U.S. Application Data

(60) Provisional application No. 63/086,968, filed on Oct. 2, 2020.

(51) Int. Cl.
| | |
|---|---|
| *H01L 21/673* | (2006.01) |
| *H05K 13/00* | (2006.01) |
| *H10F 71/00* | (2025.01) |

(52) U.S. Cl.
CPC ..... *H01L 21/6734* (2013.01); *H05K 13/0069* (2013.01); *H10F 71/137* (2025.01)

(58) Field of Classification Search
CPC ............. H01L 21/67333; H01L 21/673; H01L 21/6835; H01L 21/68313; H01L 21/68771; H01L 21/68778; H05K 13/0061–0069
See application file for complete search history.

(56) References Cited

U.S. PATENT DOCUMENTS

| | | | |
|---|---|---|---|
| 8,676,370 B2 * | 3/2014 | Lambert | H05K 13/021 700/114 |
| 9,048,272 B2 * | 6/2015 | Forsyth | B29C 65/562 |

(Continued)

FOREIGN PATENT DOCUMENTS

| | | |
|---|---|---|
| CN | 104073761 A | 10/2014 |
| DE | 102014116342 A1 | 5/2016 |

(Continued)

OTHER PUBLICATIONS

Office Action issued to Japanese Application No. 2023-520193 on Jul. 16, 2024 in 3 pages.

(Continued)

*Primary Examiner* — Tyrone V Hall, Jr.
(74) *Attorney, Agent, or Firm* — Patterson + Sheridan, LLP

(57) ABSTRACT

An assembled grid tray is disclosed, comprising a frame for holding multiple substrate trays to form a larger tray for use in a semiconductor processing tool. The frame may be comprised of two outer frame members that hold one or more of the trays, each with a magnet rail use with a maglev system. The frame may be further comprised of an inner frame member positioned between the outer frame members, which may also include a magnet rail, with the frame members being held in position by one or more outer beam (Continued)

members. The frame members may be fabricated of a material having a similar thermal expansion to trays to be placed in the frame.

20 Claims, 6 Drawing Sheets

(56) References Cited

U.S. PATENT DOCUMENTS

| 10,679,883 | B2 | 6/2020 | Bluck et al. |
| 2002/0066694 | A1 | 6/2002 | Soh et al. |
| 2002/0090287 | A1 | 7/2002 | Pelrine et al. |
| 2003/0007140 | A1* | 1/2003 | Korenaga .......... G03F 7/70758 |
| | | | 355/75 |
| 2013/0287526 | A1 | 10/2013 | Bluck et al. |

FOREIGN PATENT DOCUMENTS

| JP | 48031185 | A | 11/1974 |
| JP | 2002513243 | A | 5/2002 |
| JP | 2003168730 | A | 6/2003 |
| JP | 201114784 | A | 1/2011 |
| JP | 2012521093 | A | 9/2012 |
| JP | 2012221987 | A | 11/2012 |
| JP | 2013513933 | A | 4/2013 |
| JP | 2014148740 | A | 8/2014 |
| JP | 2015521373 | A | 7/2015 |
| JP | 2018190945 | A | 11/2018 |
| KP | 1020100001603 | A | 1/2010 |
| KR | 20110131643 | A | 12/2011 |
| KR | 20120022179 | A | 3/2012 |
| WO | 2011069687 | A1 | 6/2011 |
| WO | 2013163622 | A1 | 10/2013 |
| WO | 2019183043 | A1 | 9/2019 |

OTHER PUBLICATIONS

European Patent Application No. 21876182.3, Extended European Search Report dated Nov. 22, 2024, 8 pages.

Korean Application No. 10-2023-7014717, Office Action dated Feb. 21, 2025, 21 pages.

International Search Report and Written Opinion for PCT/US2021/046482 dated Dec. 9, 2021.

Japanese Application No. 2023-520193, Office Action dated Jul. 16, 2024, 9 pages.

Chinese Office Action for Application No. 202180064405.X mailed Aug. 16, 2025.

Japanese Office Action for Application No. 2024-221333 mailed Dec. 9, 2025.

* cited by examiner

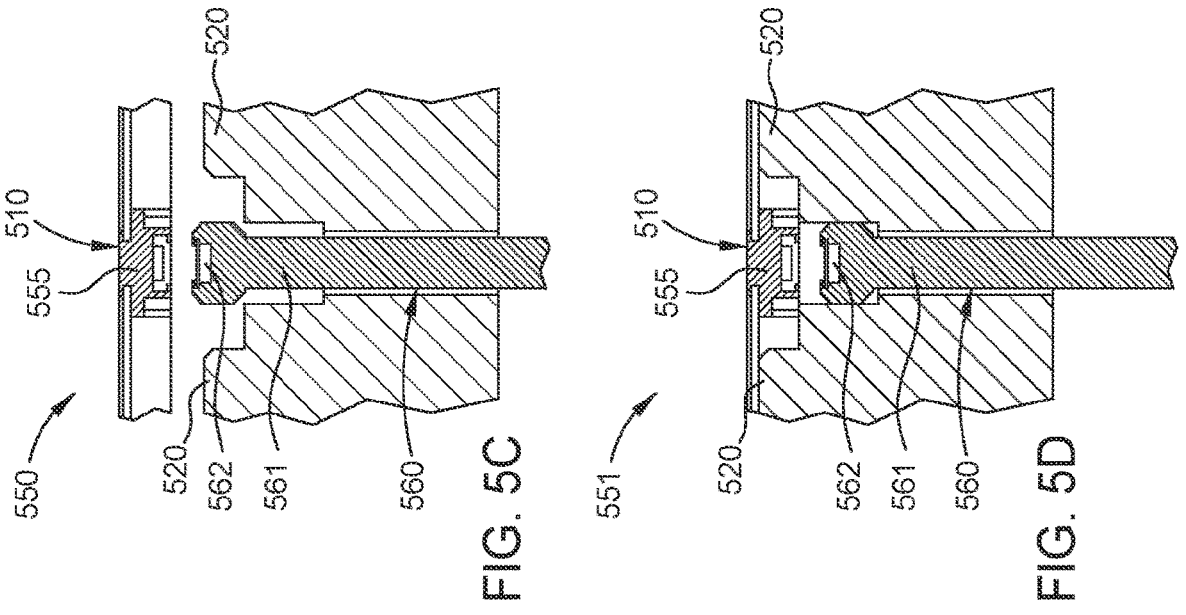
FIG. 5C
FIG. 5D
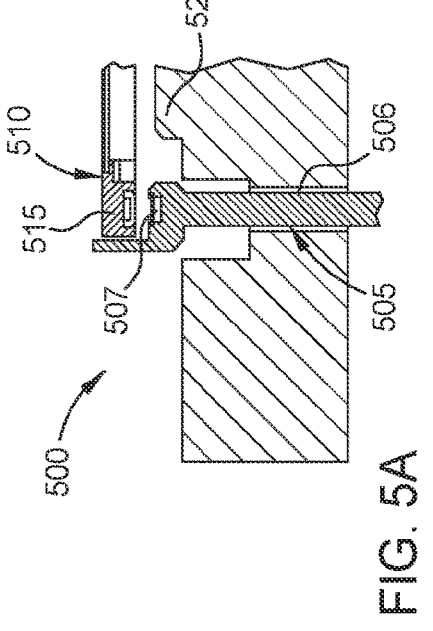
FIG. 5A
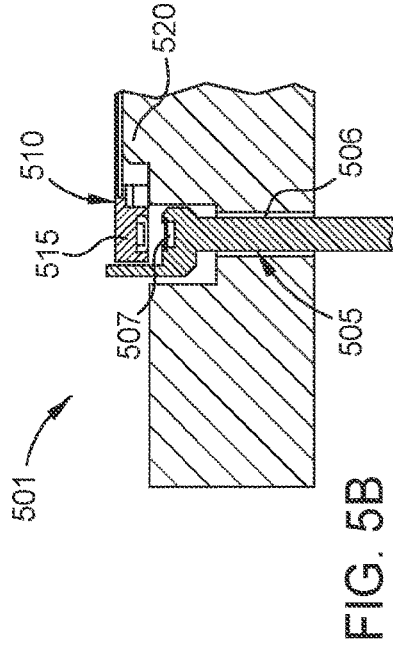
FIG. 5B

ASSEMBLED GRID TRAY

BACKGROUND

Field

Embodiments of the present disclosure generally relate to semiconductor substrate processing trays, and more particularly to assemblies comprising multiple trays.

Description of the Related Art

In the processing of semiconductor substrates for products such as solar cells for solar arrays, processing tools are able to process multiple substrates simultaneously. For many applications, substrate trays capable of holding multiple substrates are utilized to facilitate processing and transfer of multiple substrates. A tray may contain multiple pockets, each pocket configured to hold a substrate for processing.

In smaller generation solar cell processing tools having processing chamber dimensions up to and around 1941× 2305 mm, trays capable of holding for example, around up to around 99 substrates may been used. However, larger tools having processing chamber dimensions of around 2800×3205 mm and larger can accept larger tray sizes, for example trays capable of holding 208 or more substrates that may be larger than substrates used by earlier generation tools.

Fabricating larger trays, may cost substantially more than smaller trays, adding substantial cost for processing multiple substrates at scale. Moreover, a larger tray size presents additional engineering challenges, for example, in terms of sagging of the tray during processing in the extreme heat conditions of a semiconductor processing tool.

What is needed are systems and methods to overcome the deficiencies of fabricating larger trays.

SUMMARY

Methods and systems disclosed herein generally relate to an assembled grid tray, comprising a frame for holding multiple substrate trays to form a larger tray for use in a semiconductor processing tool. The frame may be comprised of two outer frame members that hold one or more of the trays, each with a magnet rail used with a maglev system. The frame may be further comprised of an inner frame member positioned between the outer frame members, which may also include a magnet rail, with the frame members being held in position by one or more outer beam members. The frame members may be fabricated of a material having a similar thermal expansion to trays to be placed in the frame.

According to certain embodiments, an assembled grid tray for semiconductor processing is disclosed that includes a first frame component, configured to retain one or more of a plurality of processing trays, each processing tray capable of holding a plurality of substrates for processing, the first frame component comprising a first frame component transport extending along a length of the first frame component, configured to enable the first frame component to move within a semiconductor processing tool, a second frame component configured to retain one or more of the plurality of processing trays and comprising a second frame component transport configured to enable the second frame component to move within the semiconductor processing tool, and a coupling configured to movably couple the assembled grid tray to the semiconductor processing tool.

In further embodiments, a system for processing semiconductor substrates is disclosed, that includes a semiconductor processing tool comprising a robot, and an assembled grid tray configured to hold a plurality of trays, each of the plurality of trays comprising a plurality of pockets, each pocket configured to hold a substrate, the assembled grid tray configured to be coupled to the robot for moving the assembled grid tray within the semiconductor processing tool.

In further embodiments, a system for processing semiconductor substrates is disclosed that includes a semiconductor processing tool, an assembled grid tray configured to hold a plurality of trays, each of the plurality of trays comprising a plurality of pockets for holding a substrate, and a controller comprising a processor configured to carry out a method for processing semiconductor substrates using the assembled grid tray, the method comprising moving the assembled grid tray containing the plurality of trays within the semiconductor processing tool.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 5A-D depict an operation of a magnetic levitation system in accordance with disclosed embodiments

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
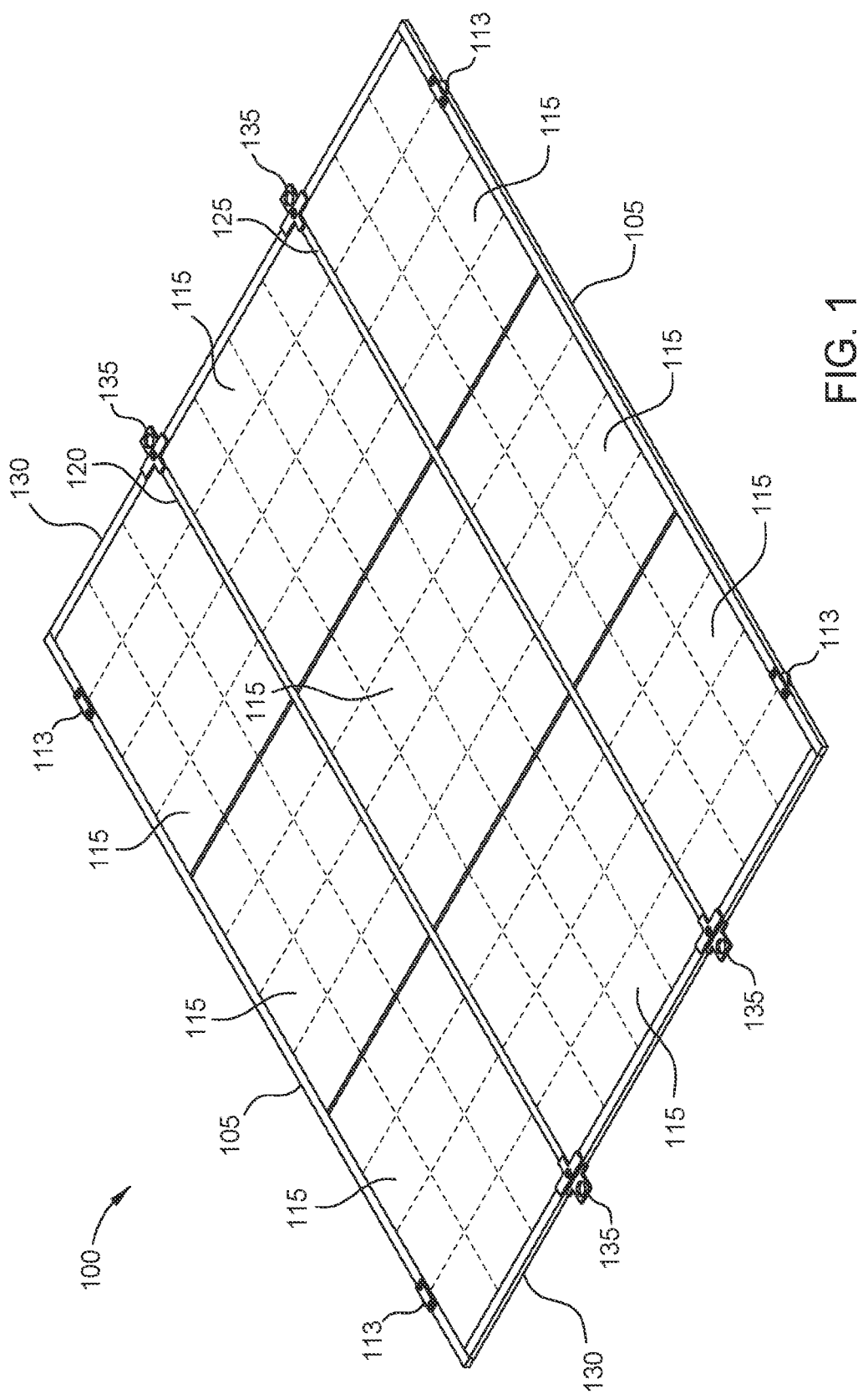
FIG. 1 depicts an assembled grid tray according to disclosed embodiments.

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to methods and systems including an assembled grid tray, comprising a frame for holding multiple substrate trays to form a larger tray for use in a semiconductor processing tool. The frame may be comprised of two outer frame members that hold one or more of the trays, each with a magnet rail use with a maglev system. The frame may be further comprised of an inner frame member positioned between the outer frame members, which may also include a magnet rail, with the frame members being held in position by one or more outer beam members. The frame members may be fabricated of a material having a similar thermal expansion to trays to be placed in the frame.

In approaches utilizing systems with smaller processing chambers, such as 1941×2305 mm, such as Gen 6 processing tools from Applied Materials of Santa Clara, CA, trays are utilized that hold, for example, 99 substrates for processing. The use of trays in this context enables efficiencies of scale, to make efficient use of processing tools, materials, person-hours, and the like. Trays may be composed of a material such as graphite, composite carbon fiber, or other material suitable for carrying substrates during processing. For example, a tray may be comprised of a material with about the same coefficient of thermal expansion as the substrates the tray may carry.

As semiconductor processing tools of increasing size become available, for example, that have processing chamber dimensions of about 2800×3205 mm and larger, for example to Gen 8 solar cell processing tools from Applied Materials of Santa Clara, CA, larger trays capable of holding 208 or more substrates can be accommodated. As would be appreciated by one of skill in the art, when more substrates are processed in a single processing cycle, efficiency is increased, driving down costs of the produced devices. However, fabricating larger trays is substantially more expensive than smaller trays, costing four times as much (and possibly more) as manufacturing a smaller. Moreover, larger tray sizes may bring additional complexities such as tray sag. Some have tried using multiple smaller trays placed close together without connecting infrastructure, however gaps between the trays and complexities that arise in handling multiple separate trays raise substantial engineering challenges.

According to disclosed embodiments, an assembled grid tray comprising a frame comprising outer frame members, one or more inner frame members, and one or more outer beams may be assembled to hold multiple trays. The assembled grid tray holding multiple smaller trays is provided to a semiconductor processing tool, such as a Gen 8 (or higher) solar cell processing tool. The assembled grid tray removes the need to manufacture larger trays, and simplifies handling of multiple smaller trays by allowing handling of all smaller trays in the assembled grid tray as a unit, and removes unwanted gaps between the trays. By using multiple smaller trays in the assembled grid tray, efficiencies of scale may be realized without incurring the cost and engineering complexities involved in developing larger trays and/or attempting to use multiple single trays individually in a processing line.

FIG. 1 depicts an assembled grid tray 100 according to disclosed embodiments. The assembled grid tray comprises outer frame members 105, also referred to herein as a first frame component and second frame component, respectively. The outer frame members 105 may be comprised of a material with a coefficient of thermal expansion about that a tray 115 carried by the assembled grid tray 100. For example, the outer frame members 105 may be comprised of graphite, carbon fiber composite, aluminum, or other material having a similar coefficient of expansion as one or more trays carried by the assembled grid tray 100. As depicted, the outer frame members 105 are placed in a direction such that the lengthwise dimension is parallel to the direction of travel of the assembled grid tray 100 for use in a semiconductor processing tool. However, it will be appreciated by one of skill in the art that the outer frame members 105 may be swapped with one or more outer beam members, discussed below, such that an outer beam member lengthwise dimension is parallel to the direction of travel of the assembled grid tray 100. In some embodiments, outer frame members 105 may comprise magnets, to enable conveyance of the assembled grid tray 100 within a semiconductor processing tool (or factory) via magnetic levitation. In other embodiments, wheels may be utilized, while in yet further embodiments a robotic assembly may carry the assembled grid tray. Moreover, one or both outer frame members 105 may further comprise outer wheels 113 to facilitate movement within a semiconductor processing tool or factory. Additional details of the outer frame members 105 will be discussed below in connection with FIG. 2.

Although trays 115 are indicted by a single reference number, one of skill in the art will appreciate that the trays need not be the same, either in material composition or size. Multiple different sized trays may be assembled such that all trays fit in the assembled grid frame.

Assembled grid tray 100 further comprises one or more inner frame members 120 and 125 respectively, either of which may also referred to herein as a third frame component. Although two inner frame members 120 and 125 are depicted, in some embodiments there may be one, or none, while in other embodiments there may be more than two inner frame members. Similar to at least one of the outer frame members 105, inner frame members 120 and/or 125 may be comprised of a material having coefficient of thermal expansion substantially equivalent to one or more of trays 115 to be carried by the assembled grid tray 100. In some embodiments, one or more of inner frame members 120 and 125 may include a number of magnets to enable the assembled grid tray to move within a semiconductor processing tool via magnetic levitation. In other embodiments, wheels may be utilized, while in yet further embodiments an assembled grid tray may be carried by one or more robotic assemblies. One or more trays 115 may be placed between an inner frame member 120 or 125 and an outer frame member 105. Inner frame members 120 and 125 will be discussed in greater detail below, in connection with FIG. 3.

Assembled grid tray 100 further comprises one or more outer beam members 130. As depicted, one or more of the outer beam members 130 are coupled to one or more of the outer frame members 105 and inner frame members 120 and/or 125 to form a rigid frame structure to carry one or more of the trays 115. Outer beam members 130 may be coupled to one or more outer frame members 105, and/or inner frame members 120 and 125 via screws or rivets, welded, glued, or some other technique that rigidly connects these elements to form a rigid frame capable of holding the one or more trays 115. One or more outer beam members 130 may further include one or more connection points 135, to couple the assembled grid tray 100 to a robot (e.g., depicted below in FIG. 2) or other conveyance to enable movement of the assembled grid tray within a semiconductor processing tool and/or factory.

Figures 2A, 2B:
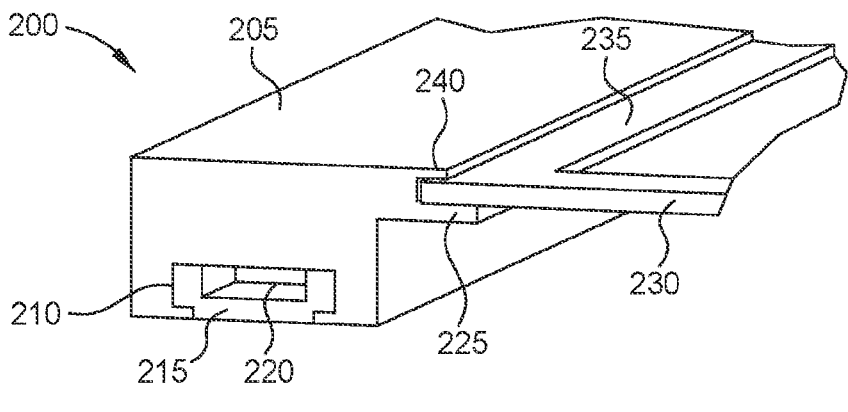
FIGS. 2A and B depict a side view of an outer frame member, according to disclosed embodiments.

FIG. 2A depicts a side view 200 of an outer frame member 205, which may be similar to one or both outer frame members 105, according to disclosed embodiments. Outer frame member 205 includes a magnet channel 210 that extends through the length of the outer frame member 205. In embodiments, a magnet tray 215 is positioned within the magnet channel 210, the magnet tray 215 holding a plurality of magnets 220 that extends through the length of the outer frame member 205, and covers the magnets 220 that may otherwise be exposed on an underside of the outer frame member 205. In embodiments the magnets 220 may be natural magnets, while in other embodiments these may be electromagnets. The outer frame member 205 has a lower ledge 225 upon which a tray 230, or multiple trays, may be held, an upper surface 235 of the tray 230 being in contact with an upper lip 240 of the outer frame member 205.

FIG. 2B depicts an alternative embodiment of the outer frame member 205. Instead of the upper lip 240, a clip 250 is movably and/or removably coupled to a top surface of the outer frame member 205, with a portion of the clip 250 extending to come in contact with the upper surface 235 of the tray 230, holding the tray in place against the lower ledge 225 of the outer frame member 205.

Figure 3A:
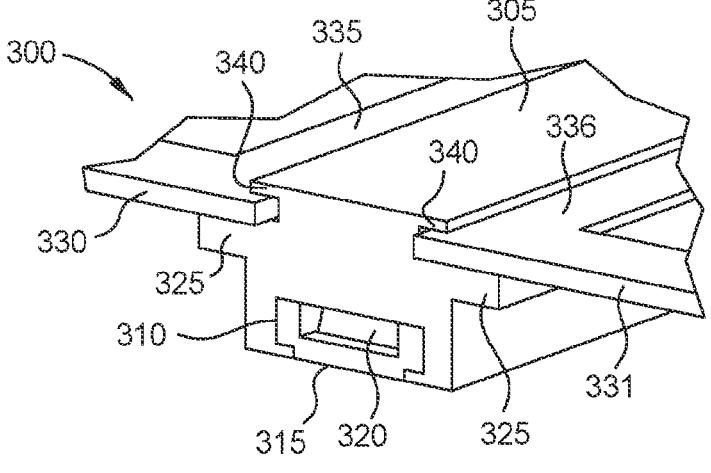
FIGS. 3A and B depict a side view of an inner frame member, according to disclosed embodiments.

FIG. 3A depicts a side view 300 of an inner frame member 305, which may be similar to one or more of inner frame members 120 and 125, according to disclosed embodiments. Inner frame member 305 includes a magnet channel 310 that extends through the length of the inner frame member 305. In embodiments, a magnet tray 315 is positioned within the magnet channel 310, the magnet tray 315 holding a plurality of magnets 320 that extends through the length of the inner frame member 305, and covers the magnets 320 that may otherwise be exposed on an underside of the inner frame member 305. In embodiments the magnets 320 may be natural magnets, while in other embodiments these may be electromagnets. The inner frame member 305 has a lower ledge 325 on each side of the inner frame member 305 upon which a tray 330 and/or 331, or multiple trays, may be placed, an upper surface 335 of tray 330 and an upper surface 336 of tray 331 being in contact with an upper lip 340 that extends from either side of inner frame member 305.

Figure 3B:
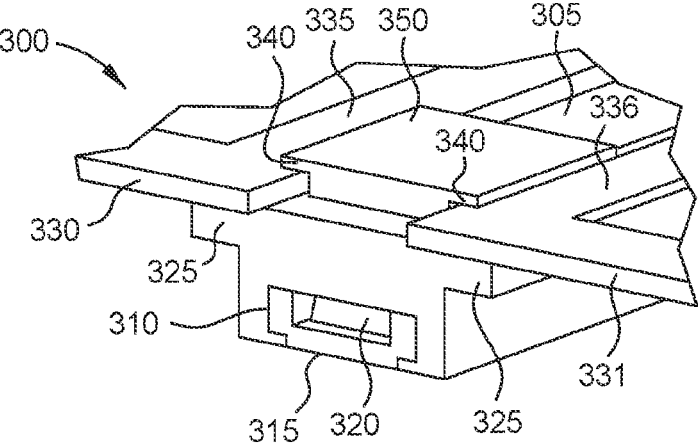

FIG. 3B depicts an alternative embodiment of the inner frame member 305. Instead of the upper lip 340, a clip 350 is movably and/or removably coupled to a top surface of the inner frame member 305, with a portion of the clip 350 extending to come in contact with the upper surface 335 of the tray 330, holding the tray 330 in place against the lower ledge 325 of the inner frame member 305.

Figure 4A:
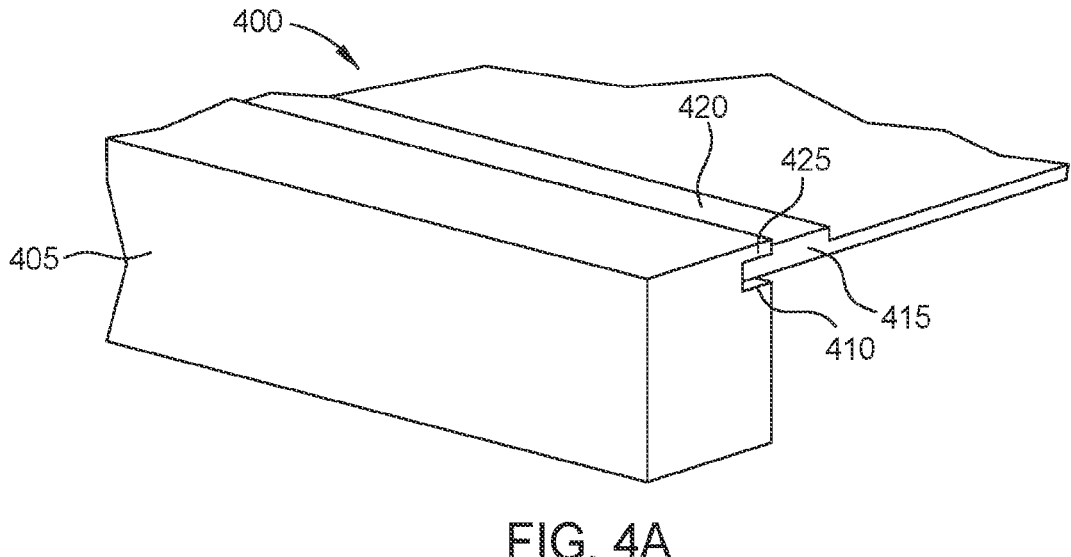
FIGS. 4A and B depict a side of out an outer beam member, according to disclosed embodiments.

FIG. 4A depicts a side view 400 of out an outer beam member 405, which may be the same as outer beam members 130, according to disclosed embodiments. Outer beam member 405 includes a lower ledge 410 extending along the length of the outer beam member 405, upon which a tray 415, or multiple such trays, may be positioned. A top surface 420 of the tray 415 may be in contact with an upper lip 425 that extends from, and along the length of, the outer beam member 405.

Figure 4B:
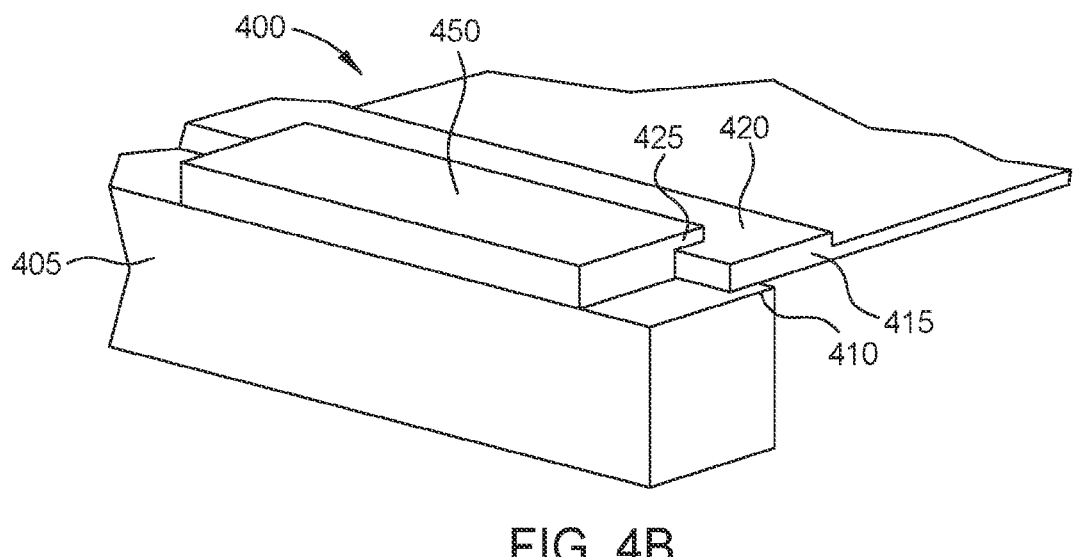

FIG. 4B depicts an alternative embodiment of the outer beam member 405. Instead of the upper lip 425, a clip 450 is movably and/or removably coupled to a top surface of the outer beam member 405, with a portion of the clip 450 extending to come in contact with the top surface 420 of the tray, holding the tray in place against the lower ledge 410 of the outer beam member 405.

FIGS. 5A-D depict an operation of a magnetic levitation system in accordance with disclosed embodiments.

FIG. 5A depicts a first operational state 500 of a magnetic levitation system 505 for conveying an assembled grid tray 510, which may be like assembled grid tray 100 of FIG. 1, along an outer frame member 515 of the assembled grid tray 510, which may be like outer frame member 205 of FIG. 2, in a semiconductor processing system to a susceptor 520. The magnetic levitation system 505 comprises a lifting arm 506 configured to move up and down, and a plurality of magnets 507.

In a first operational state 500, the lifting arm 506 is in an up position, with its plurality of magnets 507 providing upwards force on magnets of the outer frame member 515, to lift the assembled grid tray 510. A robot of a semiconductor processing system (not shown) may be coupled to one or more connection points, such as connection point 135 of FIG. 1, of the assembled grid tray 510, to position the assembled grid tray 510 above the susceptor 520.

FIG. 5B depicts a second operational state 501, the lifting arm 506 of the magnetic levitation system 505 is configured to lower, setting the assembled grid tray 510 on the susceptor for further processing. Although the operational states here depict placing the assembled grid tray for processing, one of skill in the art will understand that the magnetic levitation system and associated components of the assembled grid tray 510 may be used to convey the assembled grid tray to any type of processing, testing, cleaning, or other station within a factory.

FIG. 5C depicts a first operational state 550, which in embodiments is the same as first operational state 500, of a magnetic levitation system 505 for conveying the assembled grid tray 510, which may be like assembled grid tray 100 of FIG. 1, along an inner frame member 555 of the assembled grid tray 510, which may be like inner frame member 305 of FIG. 3, in a semiconductor processing system to a susceptor 520. The magnetic levitation system 560 comprises a lifting arm 561 configured to move up and down, and a plurality of magnets 562.

In the first operational state 550, the magnetic lifting arm 561 is in an up position, with its plurality of magnets 562 providing upwards force on magnets of the inner frame member 555, to lift the assembled grid tray 510. A robot of a semiconductor processing system (not shown) may be coupled to one or more connection points, such as connection point 135 of FIG. 1, of the assembled grid tray 510, to position the assembled grid tray 510 above the susceptor 520.

FIG. 5D depicts a second operational state 551 which in embodiments is the same as second operational state 501, the lifting arm 561 of the magnetic levitation system 560 is configured to lower, setting the assembled grid tray 510 on the susceptor for further processing. Although the operational states here depict placing the assembled grid tray for processing, one of skill in the art will understand that the magnetic levitation system and associated components of the assembled grid tray 510 may be used to convey the assembled grid tray to any type of processing, testing, cleaning, or other station within a factory.

Figure 6:
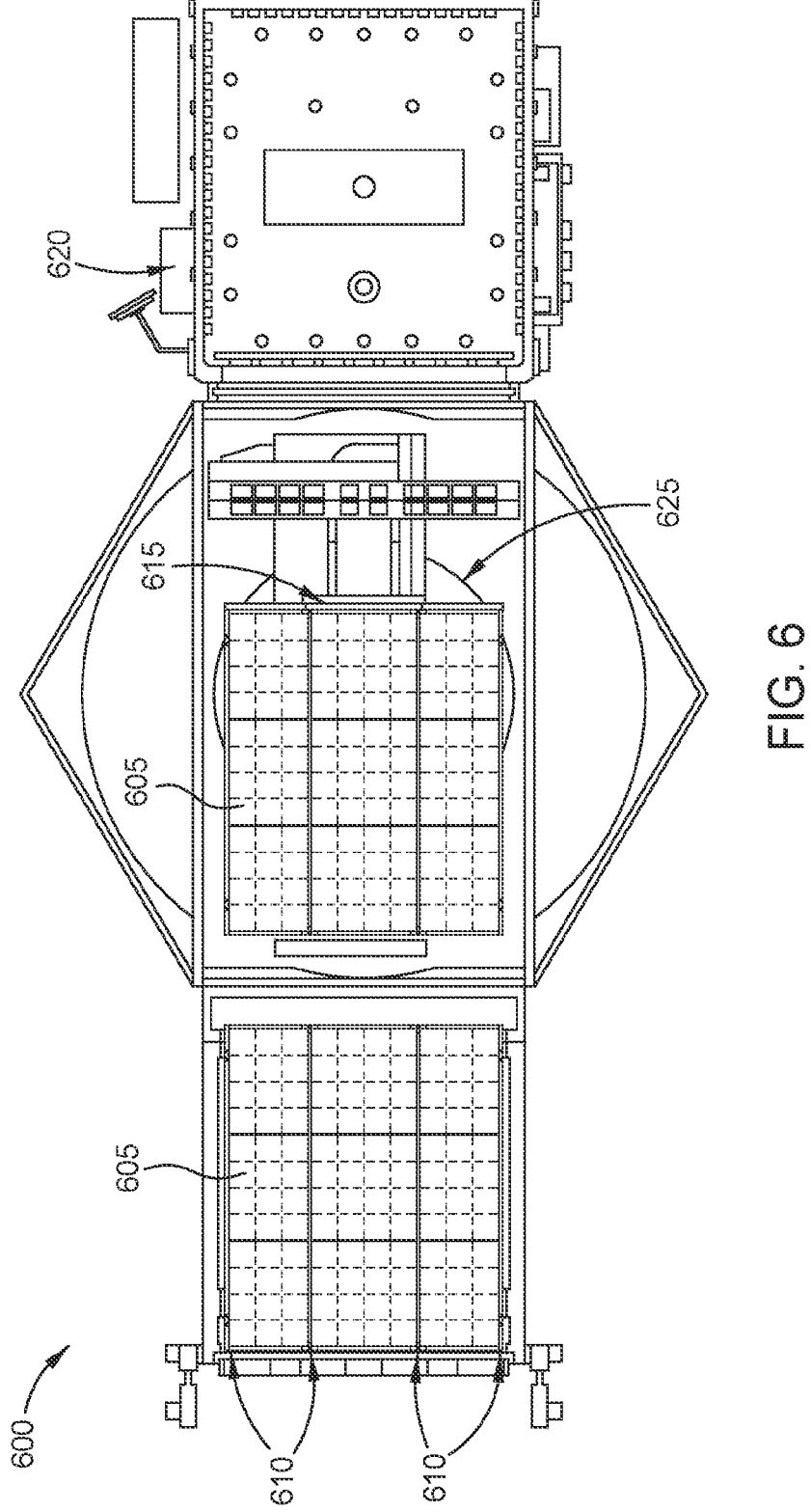
FIG. 6 depicts a semiconductor processing system according to disclosed embodiments.

FIG. 6 depicts a semiconductor processing system 600 according to disclosed embodiments.

The semiconductor processing system 600 includes an assembled grid tray 605, which may be like assembled grid tray 100 of FIG. 1, a magnetic levitation system 610 comprising magnetic levitation systems 505 and 560 of FIGS. 5A and B, a robot 615 configured to move the assembled grid tray 605, a controller 620, for controlling the semiconductor processing system 600, and a susceptor 625 which may be like susceptor 520 of FIGS. 5A&B.

While the foregoing is directed to embodiments of the present disclosure, other and further embodiments of the disclosure may be devised without departing from the basic scope thereof, and the scope thereof is determined by the claims that follow.

What is claimed is:

1. An assembled grid tray for semiconductor processing, comprising:

a first frame component, configured to retain one or more of a plurality of processing trays, each processing tray capable of holding a plurality of substrates for processing, the first frame component comprising a first frame component transport extending along a length of the first frame component, configured to enable the first frame component to move within a semiconductor processing tool;

a second frame component configured to retain one or more of the plurality of processing trays and comprising a second frame component transport configured to enable the second frame component to move within the semiconductor processing tool; and a magnetic levitation system configured to movably couple the assembled grid tray to the semiconductor processing tool via magnetic levitation, the magnetic levitation system comprising:

a magnetic rail disposed within one or more of the first frame component transport or the second frame component transport and comprising one or more frame magnets;

one or more lifting arms disposed in a susceptor of the semiconductor processing tool; and a plurality of arm magnets disposed on the one or more lifting arms, wherein the plurality of arm magnets provide an upward force on the one or more frame magnets to lift the assembled grid tray.

2. The assembled grid tray of claim 1 further comprising a third frame component positioned between the first frame component and the second frame component, configured to retain two or more of the plurality of processing trays, the third frame component comprising a third frame component transport configured to enable the third frame component to move within the semiconductor processing tool.

3. The assembled grid tray of claim 2 wherein one or more of the first frame component transport, second frame component transport, and third frame component transport comprises a magnet rail comprising one or more magnets.

4. The assembled grid tray of claim 3 further comprising an outer beam connected to the first frame component, second frame component and third frame component, the magnetic levitation system mounted to the outer beam.

5. The assembled grid tray of claim 1 wherein one of the first frame component and second frame component are comprised of a material of a substantially similar coefficient of thermal expansion as one or more of the plurality of processing trays.

6. The assembled grid tray of claim 5 wherein one of the first frame component and second frame component are comprised of one of graphite and carbon fiber composite (CFC).

7. The assembled grid tray of claim 1 wherein one of the first frame component and second frame component comprises a ledge configured to receive a bottom surface of one or more trays of the plurality of processing trays, and a lip configured to receive a top surface of one or more trays of the plurality of processing trays.

8. A system for processing semiconductor substrates, comprising:

a semiconductor processing tool comprising a robot; and an assembled grid tray configured to hold a plurality of trays, each of the plurality of trays comprising a plurality of pockets, each pocket configured to hold a substrate, the assembled grid tray configured to be coupled to the robot for moving the assembled grid tray within the semiconductor processing tool; and a magnetic levitation system configured to movably couple the assembled grid tray to the semiconductor processing tool via magnetic levitation, the magnetic levitation system comprising:

a magnetic rail disposed within assembled grid tray and comprising one or more frame magnets;

one or more lifting arms disposed in a susceptor of the semiconductor processing tool; and a plurality of arm magnets disposed on the one or more lifting arms, wherein the plurality of arm magnets provide an upward force on the one or more frame magnets to lift the assembled grid tray.

9. The system of claim 8, wherein the assembled grid tray comprises:

a first frame component comprising a first frame component transport configured to enable movement of the first frame component within the semiconductor processing tool, the first frame component configured to retain one or more of the plurality of trays;

a second frame component comprising a second frame component transport, the second frame component configured to retain one or more of the plurality of trays; and a coupling configured to be coupled to the robot.

10. The system of claim 9 further comprising a third frame component positioned between the first frame component and second frame component, the third frame component configured to retain one or more of the plurality of trays.

11. The system of claim 10 wherein one of the first frame component, second frame component, and third frame component are comprised of a material having a coefficient of thermal expansion similar to a coefficient of thermal expansion of one of the plurality of trays.

12. The system of claim 11 wherein one of the first frame component, second frame component, and third frame component is comprised of one of graphite and carbon fiber composite (CFC).

13. The system of claim 9 wherein one or more of the first frame component, and second frame component comprises one or more magnets.

14. The system of claim 13 wherein the assembled grid tray further comprises an outer beam connected to the first frame component and the second frame component.

15. A system for processing semiconductor substrates, comprising:

a semiconductor processing tool;

an assembled grid tray configured to hold a plurality of trays, each of the plurality of trays comprising a plurality of pockets for holding a substrate; and a magnetic levitation system configured to movably couple the assembled grid tray to the semiconductor processing tool via magnetic levitation, the magnetic levitation system comprising:

a magnetic rail disposed within the assembled grid tray and comprising one or more frame magnets;

one or more lifting arms disposed in a susceptor of the semiconductor processing tool; and a plurality of arm magnets disposed on the one or more lifting arms, wherein the plurality of arm magnets provide an upward force on the one or more frame magnets to lift the assembled grid tray; and a controller comprising a processor configured to process semiconductor substrates using the assembled grid tray by moving the assembled grid tray containing the plurality of trays within the semiconductor processing tool.

16. The system of claim 15 wherein the assembled grid tray comprises:

a first frame component configured to hold one or more of the plurality of trays; and a second frame component configured to hold one or more of the plurality of trays.

17. The system of claim 16 wherein the assembled grid tray further comprises a third frame component positioned between the first frame component and second frame component, the third frame component configured to hold one or more of the plurality of trays.

18. The system of claim 17 wherein one of the first, second, and third frame components comprise a plurality of magnets positioned along a length of a respective one of the first, second, and third frame components.

19. The system of claim 16 wherein one of the first frame component and second frame component is comprised of a material having a substantially similar coefficient of thermal expansion as one of the plurality of trays.

20. The system of claim 17 wherein the assembled grid tray further comprises an outer beam connected to one of the first, second, and third frame components.

\* \* \* \* \*